(12) United States Patent
Nelatury

(10) Patent No.: US 12,055,617 B1
(45) Date of Patent: Aug. 6, 2024

(54) INTEGRATORS FOR CURRENT SENSORS

(71) Applicant: The United States of America, as represented by the Secretary of the Navy, Arlington, VA (US)

(72) Inventor: Charles Nelatury, Ridley Park, PA (US)

(73) Assignee: The United States of America, as represented by the Secretary of the Navy, Arlington, VA (US)

( * ) Notice: Subject to any disclaimer, the term of this patent is extended or adjusted under 35 U.S.C. 154(b) by 212 days.

(21) Appl. No.: 17/935,687

(22) Filed: Sep. 27, 2022

Related U.S. Application Data

(63) Continuation-in-part of application No. 17/302,339, filed on Apr. 30, 2021, now Pat. No. 11,486,905.

(51) Int. Cl.
*G01R 35/00* (2006.01)

(52) U.S. Cl.
CPC .................. *G01R 35/005* (2013.01)

(58) Field of Classification Search
CPC ...................................... G01R 35/00
See application file for complete search history.

(56) References Cited

U.S. PATENT DOCUMENTS

| | | | | |
|---|---|---|---|---|
| 2005/0195002 A1* | 9/2005 | Puccio | .................. | H03L 7/0895 327/157 |
| 2010/0002807 A1* | 1/2010 | McCune, Jr. | ........... | H04L 27/14 375/319 |
| 2019/0306641 A1* | 10/2019 | Wilson | ................. | H04R 29/004 |

\* cited by examiner

*Primary Examiner* — Dominic E Hawkins
(74) *Attorney, Agent, or Firm* — Mark J. Rosen; Naval Surface Warfare Center, Philadelphia Division

(57) ABSTRACT

An integrator for use with a current sensor provides a feedback loop using a frequency discriminator, reducing drift while maintaining wide bandwidth.

13 Claims, 5 Drawing Sheets

INTEGRATORS FOR CURRENT SENSORS

STATEMENT OF GOVERNMENT INTEREST

The invention described herein may be manufactured and used by or for the Government of the United States of America for governmental purposes without payment of any royalties thereon or therefor.

FIELD OF THE INVENTION

The invention is related to the field of high bandwidth current measurements, particularly integrators for Rogowski coil current sensors.

BACKGROUND OF THE INVENTION

Current transducers are critical components in the control and protection of many devices, including rotating machines. Shunt resistors, current transformers, closed loop Hall Effect, and closed loop fluxgate are some well-known arrangements which are available for making industrial current measurements. Conventional iron-core current transformers (CTs) are usually designed with rated secondary currents between 1-5 A. The ANSI/IEEE standard C57.13-2000 specifies accuracy classes for both steady state and symmetrical fault conditions. CTs have several disadvantages, however, particularly in crowded spaces where the mechanical structures of CTs are not amenable to measuring different conductors in such tight locations. Furthermore, when the fault currents exceed rated current, the CT will saturate, resulting in distorted waveforms which have a lower RMS value.

Rogowski coils may overcome certain such disadvantages of CTs, as their flexible structures allow them to be placed circumferentially around a current-carrying conductor, and may be used in limited-space applications, to take current measurements of the current flow in such conductors. A Rogowski coil generally consists of a helical coil of wire with the lead from one end returning through the center of the coil to the originating end such that both terminals are at the same end of the coil. This configuration of a counter-wound Rogowski coil allows for its use on existing conductors arranged without access to thread the coil on the conductor because one end is open. The Rogowski coil lacks an iron or other metal core, and thus does not suffer many of the disadvantages of CTs. Many parameters may be adjusted to achieve desired results, such as the winding density, the diameter of the coil, and the rigidity of the winding, to reduce sensitivity to external currents and magnetic fields, and to reduce sensitivity to the positioning around the conductor whose current is to be measured.

The voltage induced in the coil is proportional to the rate of change of current in the conductor, and the output voltage of the Rogowski coil is considerably small, so the output is generally connected to an integrator circuit to accurately integrate the signal to provide an output signal proportional to the current. Single-chip signal processors with built-in analog to digital converters can also be used for this purpose.

As described in the art, for example by Power Electronic Measurements Ltd of Nottingham UK (PEM) in technical notes for their Rogowski coil-based products, Rogowski coils provide a variety of features making them useful for detecting variances in current, including: Wide bandwidth, especially pertinent for power electronics; the ability to measure AC current in the presence of large DC current; non-saturation of the core, so measurements are highly linear; the ability to measure large current without risk of sustaining damage; minimal loading effects; flexibility and simplicity of installation in tight spaces; galvanically isolated analog input; and safety of operation.

Rogowski coils use a non-magnetic core to support the secondary winding. This arrangement yields only weak coupling between the primary and secondary windings. As such, the outputs of Rogowski coils are mostly unperturbed by the relative position of the primary conductor running coaxially within the coil. Furthermore, they are highly resistant to other nearby conductors carrying high currents because the mutual coupling to the Rogowski coil's windings is constant. These coils accomplish these benefits through careful arrangements of the secondary winding. The secondary winding has a constant cross-section, constant turn density, and a return wire that is maintained normal to the radial cross section of the winding. Rogowski coils are known in the art, for example, in U.S. Pat. No. 9,588,147 describing such coils and electronic integrator circuits for use therewith (see FIG. 1 thereof for a typical illustration of a Rogowski coil current sensor with an integrated preamplifier).

Using classical analysis, the output of the coil is a voltage $V_c$ proportional to the rate of change of the encircled conductor's current, and is given by the time-scale derivative:

$$V_c = \mu_0 n S \left( \frac{di_p(t)}{dt} \right) \quad (1)$$

where $\mu_0$ is the magnetic constant (or permeability of vacuum), n is the spacing between the turns in the windings, S is the area of a cross section of the core as defined by the coil's windings, and $i_p$ is the current in the conductor being measured.

An electronic integrator whose time constant is matched to the geometry of the coil is used to infer the encircled current. For example, a practical op-amp integrator with DC gain control known to those of skill in the art is illustrated in FIG. 1.

In an ideal operational amplifier, no current enters the input ports. Separate from magnetic and electric coupling, real operational amplifiers generate internal noises (such as from resistors, currents, thermal noise KT/C, etc.), which are considered as uncorrelated external sources at each input. The presence of input current noise implies that the feedback capacitor will saturate in the absence of a real input signal and produce a voltage drift at the output. To mitigate this drift, a resistor is added in parallel to discharge the capacitor at DC. Smaller resistors will discharge the capacitor quickly but they also lower the cutoff frequency thereby reducing the bandwidth of the integrator. A commonly used heuristic in electronic design is the "10× rule" which states that the feedback resistor must be 10 times larger than the input resistor. This permits an acceptable compromise between lowering the DC gain while maintaining the bandwidth of the overall sensor. If a very large resistor is used instead, say 100 times larger, then the input current noise will be integrated and consequently the drift will be larger.

There are known methods for performing electronic integration. One common method involves the use of an integrator which is pre-cascaded by a high-pass filter. The difficulty in matching the time constants in such solutions is described in the art, for example, by PEM. The art is in need of improved integrators for Rogowski coil and other current sensors with advantages over, and without the disadvantages of, conventional designs.

SUMMARY OF THE INVENTION

Having observed the aforementioned problems with conventional integrators for Rogowski coils, the inventor hereof provides solutions in the form of methods and devices to improve the performance of such integrators for current sensors by reducing drift while maintaining wide bandwidth. In the present invention, field-effect transistors (FETs) may be used to minimize the drift while simultaneously allowing for a very large feedback resistor. A junction-gate field-effect transistor (JFET) may be placed in parallel to the feedback resistor. By operating the JFET in the triode region, the net resistance in the feedback path can be controlled electronically. Alternatively, a metal oxide field-effect transistor (MOSFET) may be used, in which case the control signal is well isolated from the resistor terminal. When the FET is conducting, the net feedback resistance is the parallel combination $R_f \| R_{on}$. When the FET is open, the net feedback resistance is slightly larger than $R_f$.

The method and devices of the invention modify the feedback path of an integrator in such a manner as to minimize drift in the output resulting from input current noise while simultaneously preserving the bandwidth. This configuration provides both automatic reset and gain control, by use of FET networks which act as voltage controlled variable resistors. With this configuration, the integrator of the present invention reduces drift because high frequencies having more negative voltage are insufficient to close the FET, but low frequencies with less negative voltage close the FET and bring it into the circuit. Thus, drift from low frequencies is effectively reduced while maintaining the wide bandwidth of the integrator.

The invention described herein employs a method based on modulating the feedback path of the integrator to adjust the gain on the output. The generality of the input to such an integrator allows for it to be used not only in current measurements but also in other fields in which drift should be minimized while bandwidth is maintained, such as navigation and shock measurements. For example, accelerometer outputs can be double integrated using the method of the invention to produce low drift position estimates. The present invention is useful in a variety of applications, employing frequency-based gate voltage modulators (i.e., frequency discriminators). Such configurations include, but are not limited to, diode pumped frequency discriminators; applications employing linearized JFETs in feedback paths; and practical op-amp integrators. Additionally, the feedback path may be controlled by frequency discrimination which may be realized by various other configurations involving components ranging from passive elements to specialized integrated circuits (ICs) including, among others, charge pumps, switched current source and one shot timers, RMS-to-DC converters and differentiators, and zero-crossing detectors.

In one aspect, the invention is directed to an integrator circuit for use with current sensors, having an input for receiving an input signal from a current sensor; an op-amp receiving the input signal from the input, the op-amp having an output providing an output voltage signal, the output voltage signal capable of being tapped for measurement; an integrator resistor and an integrator capacitor in parallel; a FET having a critical threshold voltage; and a frequency discriminator. In the presence of signal noise, the frequency discriminator output voltage signal controls the FET to either close the gate when the frequency discriminator output voltage signal exceeds the critical threshold voltage or open the gate when the frequency discriminator output voltage signal is less than the critical threshold voltage, such that the drift resulting from the signal noise is minimized while simultaneously maintaining the wide bandwidth of the integrator.

In another aspect, the FET is a JFET, or alternatively a MOSFET. In another aspect, the output voltage signal is tapped for measurement by an external meter. In another aspect the frequency discriminator may be constructed on a single chip such that all the components of the frequency discriminator are situate on a single module. In yet another aspect, the current sensor is a Rogowski coil.

In one aspect, the frequency discriminator is a charge pump, the charge pump being a diode pump comprising a first capacitor and a second capacitor, a load resistor, a diode, a transistor, and a power source, the charge pump receiving the output voltage signal and providing a frequency discriminator output voltage signal. In another aspect, the charge pump is a zener regulated frequency discriminator comprising an integrated circuit and a zener, the charge pump receiving the output voltage signal and providing a frequency discriminator output voltage signal. The charge pump may have an LM2917 integrated circuit. In another aspect, the frequency discriminator is an RMS frequency discriminator comprising a differentiator and a divider, and at least two RMS-DC converters, the RMS discriminator receiving the output voltage signal and providing a frequency discriminator output voltage signal. In another aspect, the frequency discriminator is a zero-crossing detector comprising a voltage divider, the voltage divider further comprising two resistors, a diode, and a counter, the zero-crossing detector receiving the output voltage signal and providing a frequency discriminator output voltage signal. In another aspect, the frequency discriminator is a switched current source with a one shot timer comprising an integrated circuit, a comparator, the one shot timer/R-S flip=flop, the switched current source, and a lossy integrator, the switched current source with a one shot timer receiving the output voltage signal and providing a frequency discriminator output voltage signal. In some aspects, the integrated circuit is an LM331.

These and other aspects of the invention will be readily appreciated by those of skill in the art from the description of the invention herein.

DETAILED DESCRIPTION OF THE INVENTION

Figure 1:
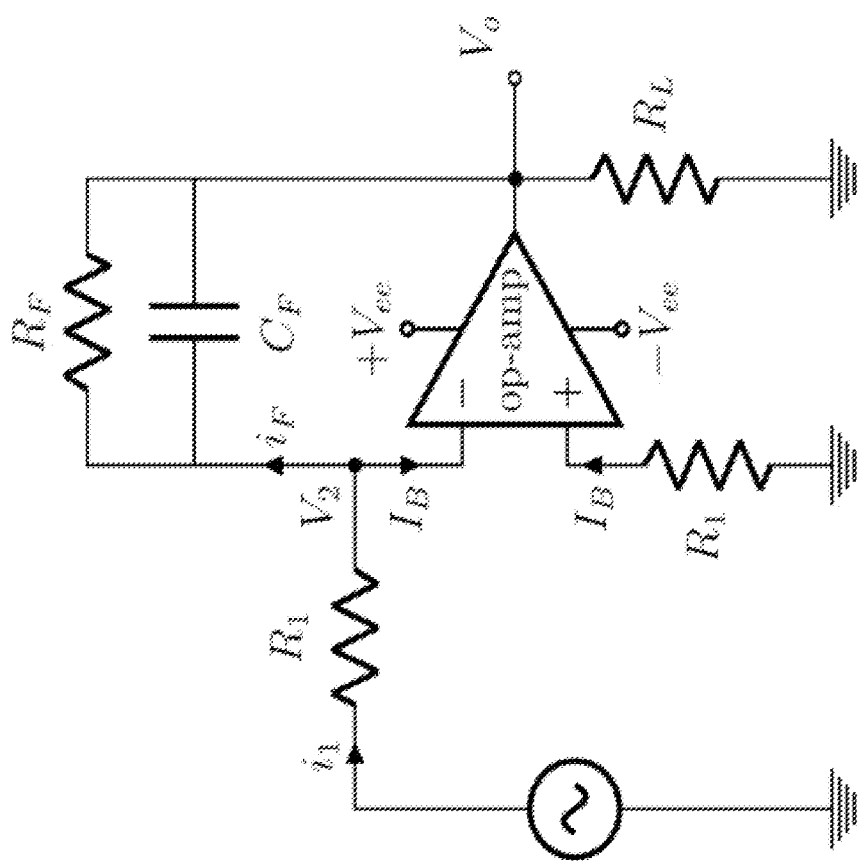
FIG. 1 depicts an embodiment of a practical integrator known in the art for use with Rogowski coils.

With reference to the Figures, FIG. 1 illustrates a typical integrator known in the art, in which the incoming current $i_1$ is passed to an op-amp, resistors and a capacitor, and emerges as output signal $V_{out}$ providing the measurement of the incoming current. Such an integrator is prone to drift from high and low frequency noise, and while the choice of resistors may be able to reduce such drift, it can do so effectively only at the cost of a reduction of bandwidth. With lower values for the resistor $R_f$, the capacitor $C_f$ is discharged quickly and drift is reduced, but the cutoff frequency is concomitantly lowered, thereby reducing the effective bandwidth of the integrator. With higher values for the resistor $R_f$, the capacitor $C_f$ is discharged less rapidly, maintaining bandwidth, but the input current noise will be integrated, thereby resulting in larger drift.

The invention described herein provides a feedback loop capable of reducing drift and maintaining bandwidth by using a FET in the circuit which acts as a voltage controlled variable resistor. In a typical n-type JFET, a negative voltage from gate to source $V_{gs}$ increases the depletion region. As $V_{gs}$ becomes more negative it decreases the channel width. The current going from drain to source $I_{ds}$ depends on the channel resistance drain to source $r_{ds}$. When the depletion region widens and the channel narrows, the channel resistance $r_{ds}$ increases until the channel is depleted of all charge carriers and no current flows. The particular $V_{gs}$ where this occurs is known as the pinch off voltage $V_c$. When the voltage drain to source $V_{ds}$ increases, $V_{gs}$ remains constant while the reverse bias voltage of each pn junction will increase as we move up the channel. The depletion region assumes a tapered shape and the channel becomes pinched off at the drain end. The maximum current at the drain $I_d$ occurs when $V_{gs}=0$ and is defined as current drain to source shorted (or saturated), or $I_{dss}$. When the JFET is biased with a large $V_{ds}$ and $V_c < V_{gs} < 0$, it will operate in the active region (or the saturation) region.

In the JFET linear region, (also known as the ohmic region or the triode region), the drain current is expressed as $$I_d = V_{ds}\left(\frac{2I_{dss}}{V_c^2}\right)\left(V_{gs} - V_c - \frac{V_{ds}}{2}\right) \quad (2)$$

When $V_{ds} \ll 2(V_{gs}-V_c)$, i.e., when the FET is operating in the linear region, $$I_d \approx V_{ds}\left(\frac{2I_{dss}}{V_c^2}\right)(V_{gs} - V_c) \quad (3)$$

By definition, the channel resistance $r_{ds}$ is $$r_{ds} = \frac{V_{ds}}{I_d}\bigg|_{V_{ds}\text{small}} = \left[\left(\frac{2I_{dss}}{V_c^2}\right)(V_{gs} - V_c)\right]^{-1} \quad (4)$$

Figure 2:
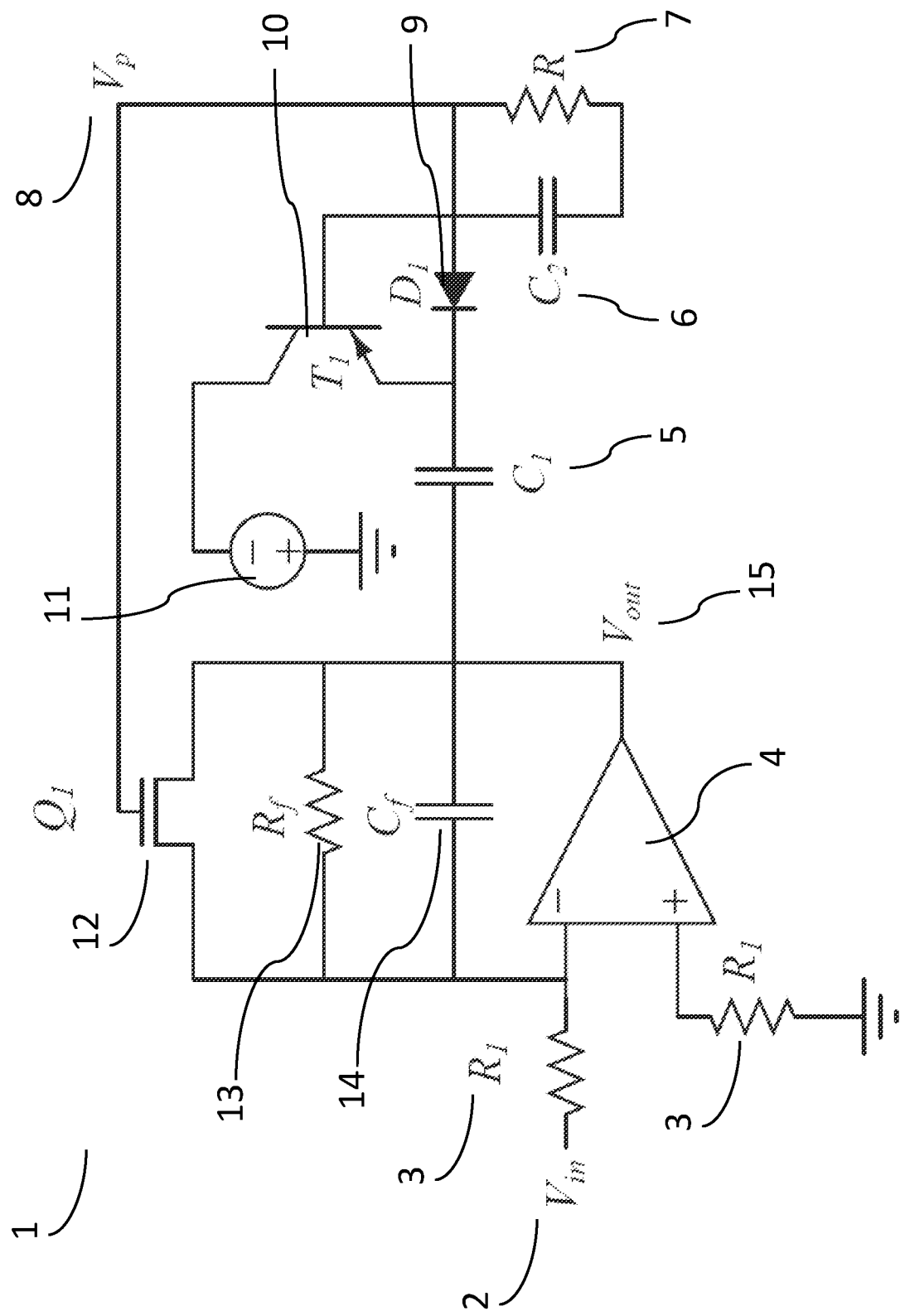
FIG. 2 depicts an embodiment of the invention, illustrating an integrator as a practical operational amplifier with frequency dependent gain control and automatic reset, allowing the frequency discriminator to drive the gate voltage of the FET via a frequency discriminator.

With the properties of such a FET, an improved integrator may be constructed. In FIG. 2, an integrator (1) of the invention is illustrated. The coil voltage $V_{in}$ (2) is the input of the operational amplifier and it is a relatively weak signal. After passing through resistor $R_1$ (3) the signal passes to op-amp (4). Rather than using the input signal alone, as is done in conventional integrators, the invention uses the output $V_{out}$ (15) of the operational amplifier to automatically control the gain of the integrator (1), and in the extreme case of DC input signals, to reset the integrator (1).

This control is accomplished by means of a frequency to voltage converter. In some embodiments, the converter is a diode pump comprising capacitors $C_1$ (5) and $C_2$ (6), resistor R (7), diode $D_1$ (9), transistor $T_1$ (10), and a power source (11). The first negative swing at the output $V_{out}$ (15) charges $C_1$ (5) through the base-emitter diode of $T_1$ (10) to $V_{out}$ (15), and the subsequent positive swing to zero causes $C_1$ (5) to discharge into $C_2$ (6) so that $$V_p = V_{out}\left(\frac{c_1}{c_1 + c_2}\right) \quad (5)$$

where $V_p$ (8) is the diode pump output signal. The second negative swing of $V_{out}$ (15) charges $C_1$ (5) to $(V_p+V_{out})$ volts because the right-hand connection of $C_1$ (5) is caught at $V_p$ (8) by $T_1$ (10). When $V_{out}$ (15) starts to return to ground for the second time $D_1$ (9) conducts immediately, in contrast to the situation in which $V_{out}$ (15) must rise by $$V_{out}\left(\frac{c_1}{c_1 + c_2}\right)$$

before $D_1$ (9) would conduct. The full rise of $V_{out}$ (15) is therefore shared by $C_1$ (5) and $C_2$ (6) as on the first positive swing, and the output therefore rises, as before by $$V_{out}\left(\frac{c_1}{c_1 + c_2}\right).$$

This process is repeated so $V_p$ (8) is a staircase function whose steps are given by $$V_{out}\left(\frac{c_1}{c_1 + c_2}\right).$$

The addition of the load resistor R (7) in parallel to the large $C_2$ (6) results in equal increments of charge transfer per cycle and the pump acts as a frequency discriminator. The components of the diode pump are selected so that at DC (or an appropriately chosen low frequency limit) $V_p$ (8) reaches the critical threshold ($V_c$) of the FET, which then begins to conduct. This will result in integrator capacitor $C_f$ (14) discharging much more quickly than it would in the conventional integrator depicted in FIG. 1. When $V_p$ (8) is less than $V_c$, the FET is open, the net impedance of the feedback path is slightly smaller than integrator resistor $R_f$ (13). The resulting signal present at $V_{out}$ (15) may be tapped for reading by a meter in addition to its being used to control the gain of the integrator (1). Configured in this manner, the integrator maintains a large bandwidth while minimizing DC drift.

In some embodiments, the diode pump may be constructed on a single chip such that all the components of the diode pump are situate on a single module. In other embodiments, the frequency-to-voltage converter may be a chip such as an LM331 converter, in which case a p-type FET (such as a p-type JFET) would be used in place of an n-type FET.

Figure 3:
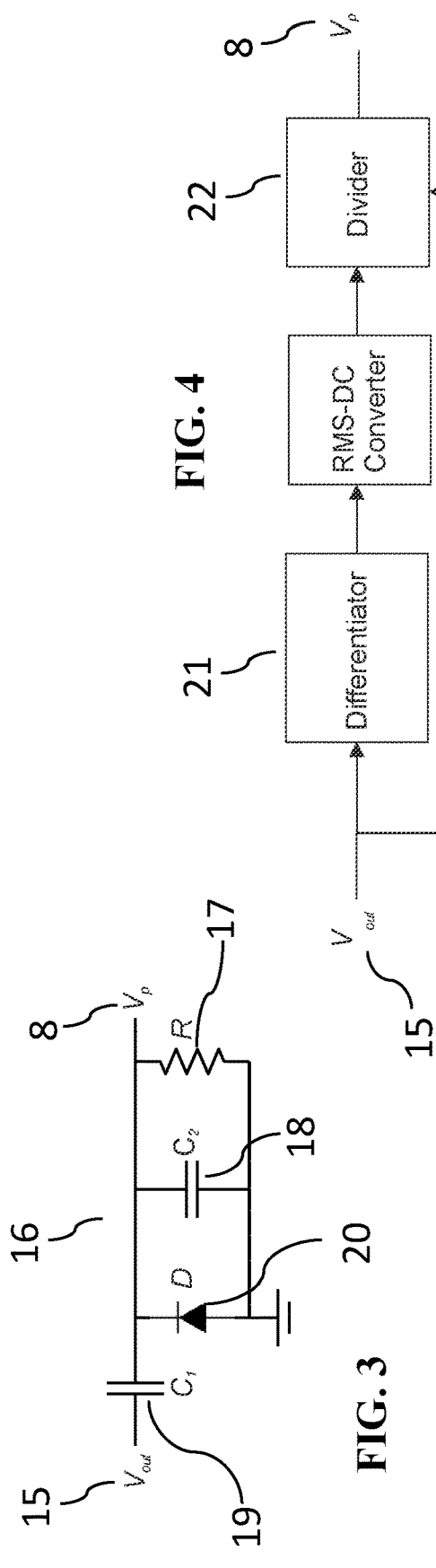
FIG. 3 depicts an embodiment of the invention, illustrating a charge pump.

In some embodiments, the frequency discrimination is accomplished through the use of a charge pump (16). For example, a single diode (20) may be used to construct a simple charge pump as shown in FIG. 3 in which a load resistor R (17) is placed across a charge pump (16). After each charging impulse from the input square wave, capacitor $C_2$ (18) will discharge across R (17) for a time period equal to the period of the input signal. During this phase, the evanescent charge on $C_2$ (18) decays as $$q = q_2 e^{-\frac{t}{RC_2}} \quad (6)$$

where $q_2$ is the initial charge on $C_2$, and t is measured from the charging edge of the square wave. The stored charge dissipated into R over 1/f is given by the initial charge minus the stored charge after a time 1/f and is expressed by $$\Delta q_2 = q_2 \left(1 - e^{-\frac{1}{RC_2 f}}\right). \quad (7)$$

If $fRC_2 \gg 1$, we can approximate the exponential in Eq. (2) by the first two terms of its Taylor series expansion giving, $$\Delta q_2 = \frac{q_2}{fRC_2}. \quad (8)$$

When this is set equal to the charge gained per cycle according to charge conservation, $V_p$ can be expressed as $$V_p = \frac{C_1 C_2 R f V_{out}}{C_1 + C_2 + C_1 C_2 R f}. \quad (9)$$

Enforcing the constraint that $C_1 C_2 R f \ll C_1 + C_2$, a linear relationship between voltage and frequency is obtained:

$$V_p = \frac{C_1 C_2}{C_1 + C_2} R V_{out} f. \quad (10)$$

Since the charge pump (16) itself requires that capacitor $C_1$ (19) $\ll C_2$ (18), the imposed design requirements can be simplified to $$\frac{1}{C_2} \ll R f \ll \frac{1}{C_1}. \quad (11)$$

Within this restricted range of frequencies, the output voltage of the circuit will be proportional to the frequency of the input wave. Similar results hold for other alternating input signals. This configuration provides a method to easily adjust the range of frequencies over which the integrator feedback path can be modulated. Frequency-based gate voltage modulators may be referred to herein as frequency discriminators. For low frequencies, however, larger components may be more suitable in order to maintain linearity due to the assumption that $fRC_2 \gg 1$. Enhancements to the simple charge pump described above have been made in the context of tachometry. A zener regulated frequency discriminator is described below in Example 2 and illustrated in FIG. 6.

Figure 4:
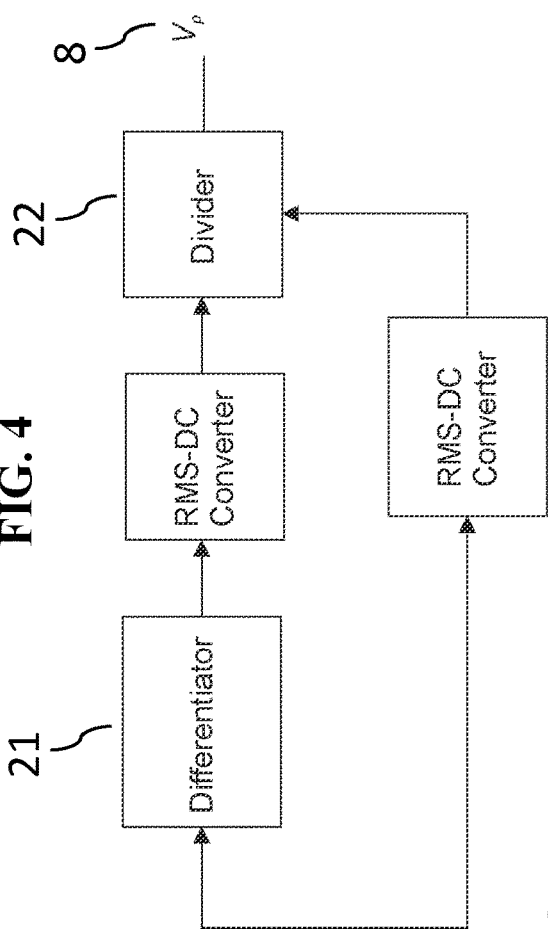
FIG. 4 depicts an embodiment of the invention, illustrating frequency discrimination by ratio of RMS.

In some embodiments, the frequency discrimination is accomplished through the use of RMS and differentiators. For example, the arrangement depicted in FIG. 4 shows frequency discrimination by ratio of RMS. Such a configuration produces a voltage proportional to the frequency of the signal on the left side. Consider a signal of interest whose frequency is $$V_{out}(t) = A \sin(2\pi f t). \quad (12)$$

The derivative is $$V_{out}'(t) = 2\pi f A \tau_d \cos(2\pi f t) \quad (13)$$

where $\tau_d$ is the time-constant of the differentiator (21). Dividing the RMS value of Eq. (8) by the RMS value of Eq. (12) gives $$V_p = \frac{V_{out,RMS}'}{V_{out,RMS}} = k f \quad (14)$$

where $k = 2\pi k_d \tau_d$ where $k_d$ is the scale factor of the divider (22). This method may be realized using dividers (22) such as the AD734 IC and differentiators (21) constructed using operational amplifiers.

Figure 5:
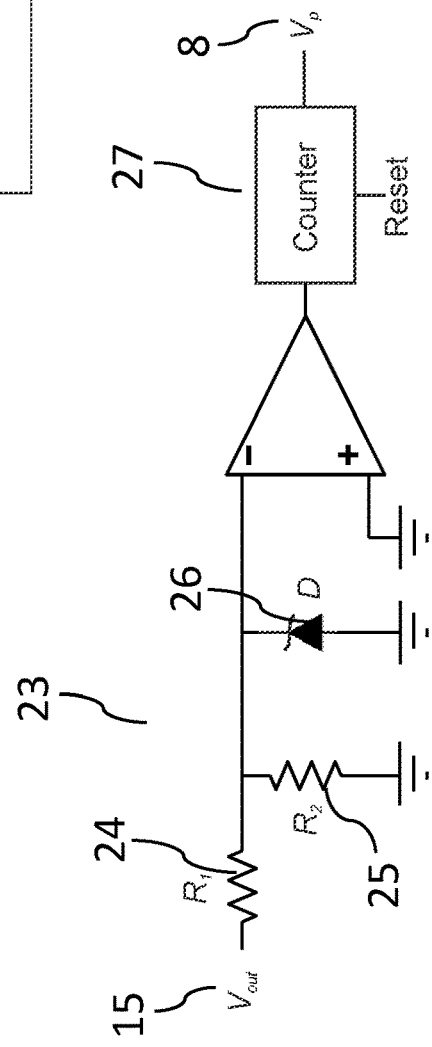
FIG. 5 depicts an embodiment of the invention, illustrating frequency discrimination by zero-crossing counting.

In some embodiments, the frequency discrimination is accomplished through the use of a zero-crossing detector (23). If the signal is appropriately centered at zero, the number of times the signal crosses zero over a period of time gives the frequency of that signal. A simple zero-crossing detector is shown in FIG. 5. This circuit changes the comparator's output state when the AC input crosses the zero reference voltage. The comparator inverting input is set to the zero reference voltage and the attenuated input is applied to the non-inverting input. The voltage divider $R_1$ (24) and $R_2$ (25) attenuates the input signal while the diode D (26) is used to ensure that the non-inverting input never goes below the negative input common mode limit of the comparator. The comparator output is converted to pulses which are counted by a periodically-resetting counter (27). Other zero-crossing circuits involve the use of opto-couplers where an LED is used to generate the pulses to be counted over the designed period. These mechanisms require short reset periods for fast operations.

Figure 7:
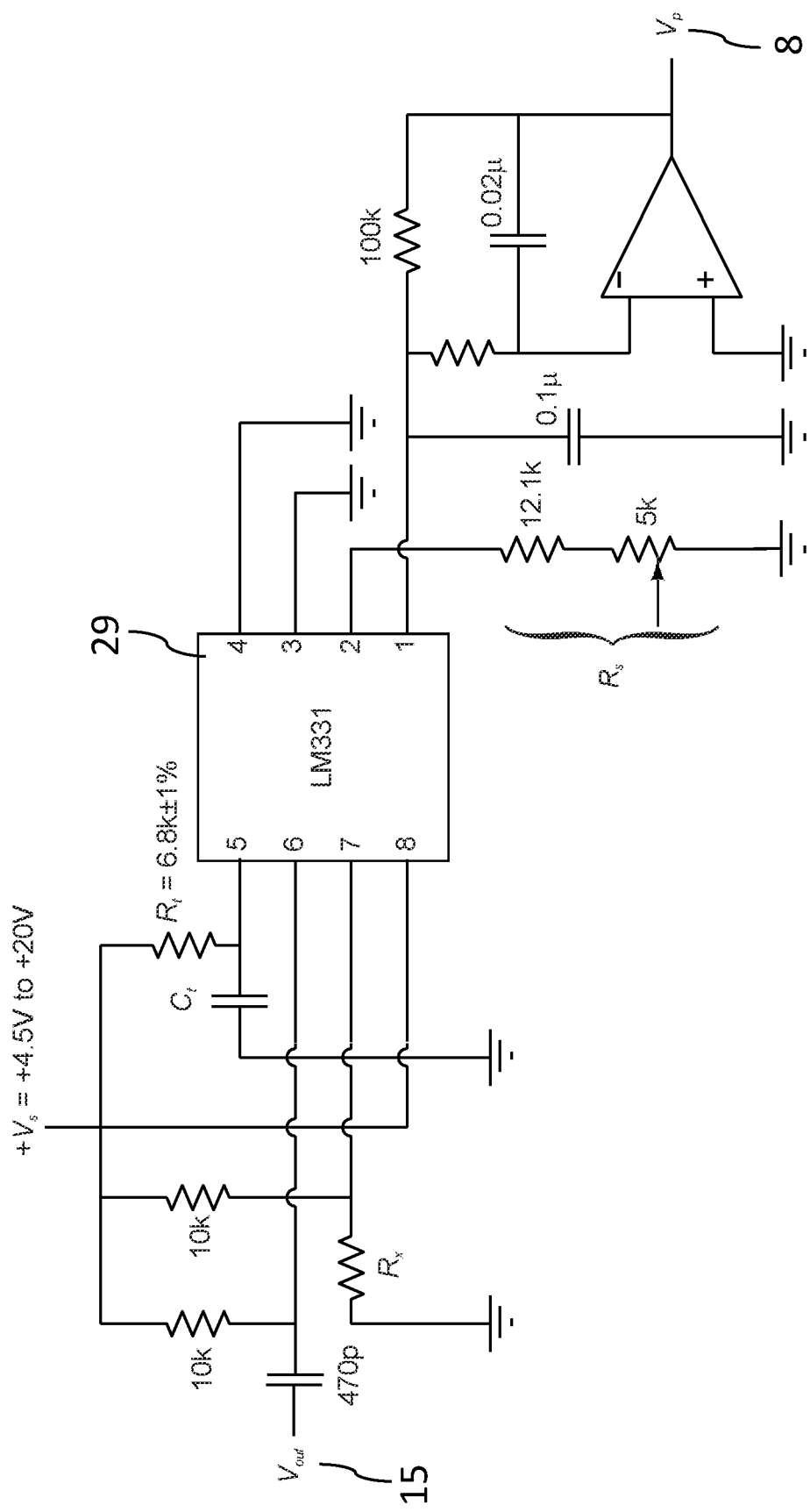
FIG. 7 depicts an embodiment of the invention, illustrating an LM331 integrated circuit using an R-S flip-flop, internal bandgap voltage reference, and a current mirror.

In other embodiments, the frequency discrimination is accomplished through the use of switched current sources and one shot timers. Integrated circuits such as ADVFC32, AD650, LM331, and NJM4151 utilize an internal bandgap voltage reference, a comparator, a one shot timer/R-S flip-flop, a switched current source, and a lossy integrator. The principle of operation is generally that the pulse input is differentiated by a CR network and the negative going edge causes the input comparator to trigger the timer circuit. An operational amplifier provides a buffered output and also acts as a 2-pole filter to suppress the output ripple. See, e.g., the use of an LM331 IC described below in Example 3, an illustration of which is depicted in FIG. 7.

Those of skill in the art will readily appreciate that the components of the integrator and diode pump may be chosen to achieve particularly desired results in particular applications.

EXAMPLES

The following Examples serve to illustrate the present invention and are not intended to limit its scope in any way.

Example 1—an Integrator for Use with Current Sensors

An integrator (1) for use with current sensors such as Rogowski coils is constructed as follows. Resistors $R_1$ (3) are selected with resistance of 10 kΩ ohms. Diode pump capacitor $C_1$ (5) is selected with capacitance of 1 μF, and $C_2$ (6) with capacitance of 100 μF. Load resistor R (7) is selected with resistance of 10 kΩ ohms. Integrator resistor $R_f$ (13) is selected with resistance of 100 kΩ ohms. Integrator capacitor $C_f$ (5) is selected with capacitance of 100 nF. The power source (11) is set to −10V. Diode $D_1$ (9) is a 1N4148 standard silicon switching signal diode. Transistor $T_1$ (10) is a 2N3906 standard PNP transistor. FET $Q_1$ (12) is a JFET J310 standard N-channel JFET. The op-amp is selected from standard op-amps such as LM741 and LM324. When a signal from a current sensor such as a Rogowski coil is connected at $V_{in}$ (2) the integrator thus constructed provides at $V_{out}$ (15) from the op-amp a signal which may be read by a meter, and which signal provides an accurate measurement of the current with reduced drift and wide bandwidth.

Example 2—a Zener Regulated Frequency Discriminator

Figure 6:
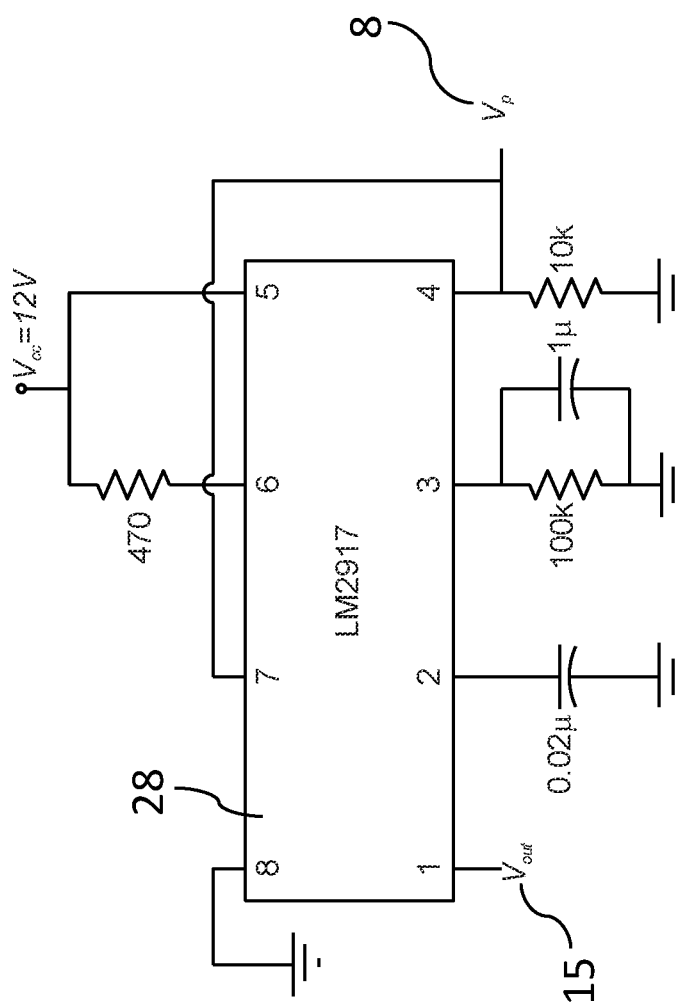
FIG. 6 depicts an embodiment of the invention, illustrating a zener regulated frequency discriminator.

FIG. 6 shows a zener regulated option via a Texas Instruments™ LM2917 IC (28). The input stage of this configuration uses a charge pump to convert the frequency into a DC voltage as before. However, for applications where an output voltage or current must be unaffected by supply voltage variations, the most important consideration is that the internal circuitry requires about 3 mA at the voltage level. This may be provided by the zener. At low supply voltages there must be some current flowing in the resistor above the 3 mA circuit current to operate the regulator. For example, if the raw supply varies from 9V to 16V, a resistance of 470Ω will minimize the zener voltage variation to 160 mV. If the resistance goes under 400Ω or over 600Ω the zener variation quickly rises above 200 mV for the same input variation. The values of the components as shown in FIG. 6, are chosen to fine tune the operation of the frequency discriminator. Depending on the application and desired results, other particular values of the components may be chosen to fine tune the circuit, as will be readily appreciated by those of skill in the art.

Example 3—an LM331 Uses an R-S Flip-Flop, Internal Bandgap Voltage Reference, and a Current Mirror FIG. 7 shows a configuration involving a Texas Instruments™ LM331 IC (29). This circuit contains a stable band gap reference at 1.9 VDC. A current pump circuit causes a current to switch between ground and one of the pins depending on the state of the R-S flip-flop. This configuration provides a method to detect very low frequency currents because these ICs can detect very low frequencies. These circuits may produce a ripple at low frequencies. The values of the components as shown in FIG. 7, are chosen to fine tune the operation of the frequency discriminator. Depending on the application and desired results, other particular values of the components may be chosen to fine tune the circuit, as will be readily appreciated by those of skill in the art.

The present invention is not to be limited in scope by the specific embodiments described above, which are intended as illustrations of aspects of the invention. Functionally equivalent methods and components are within the scope of the invention. Various modifications of the invention, in addition to those shown and described herein, will be readily apparent to those skilled in the art from the foregoing description. Such modifications are intended to fall within the scope of the appended claims. All cited documents are incorporated herein by reference.

What is claimed is:

1. An integrator circuit for use with current sensors, comprising:
    an input for receiving an input signal from a current sensor;
    an op-amp receiving the input signal from the input, the op-amp having an output providing an output voltage signal, the output voltage signal being capable of being tapped for measurement;
    an integrator resistor and an integrator capacitor in parallel;
    a FET having a critical threshold voltage; and
    a frequency discriminator;
    wherein, in the presence of a signal noise, the frequency discriminator output voltage signal controls the FET to either close the gate when the frequency discriminator output voltage signal exceeds the critical threshold voltage or open the gate when the frequency discriminator output voltage signal is less than the critical threshold voltage, such that a drift resulting from the signal noise is minimized while simultaneously maintaining a bandwidth of the integrator circuit.

2. The integrator circuit of claim 1, wherein the frequency discriminator is a charge pump, the charge pump being a diode pump comprising a first capacitor and a second capacitor, a load resistor, a diode, a transistor, and a power source, the charge pump receiving the output voltage signal and providing a frequency discriminator output voltage signal.

3. The integrator circuit of claim 1, wherein the frequency discriminator is a charge pump, the charge pump being a zener regulated frequency discriminator comprising an integrated circuit and a zener, the charge pump receiving the output voltage signal and providing a frequency discriminator output voltage signal.

4. The integrator circuit of claim 1, wherein the frequency discriminator is an RMS frequency discriminator comprising a differentiator and a divider, and at least two RMS-DC converters, the RMS discriminator receiving the output voltage signal and providing a frequency discriminator output voltage signal.

5. The integrator circuit of claim 1, wherein the frequency discriminator is a zero-crossing detector comprising a voltage divider, the voltage divider further comprising two resistors, a diode, and a counter, the zero-crossing detector receiving the output voltage signal and providing a frequency discriminator output voltage signal.

6. The integrator circuit of claim 1, wherein the frequency discriminator is a switched current source with a one shot timer comprising an integrated circuit, a comparator, the one shot timer/R-S flip=flop, the switched current source, and a lossy integrator, the switched current source with a one shot timer receiving the output voltage signal and providing a frequency discriminator output voltage signal.

7. The integrator circuit of claim 1, wherein the current sensor is a Rogowski coil.

8. The integrator circuit of claim 3, wherein the integrated circuit is an LM2917.

9. The integrator circuit of claim 6, wherein the integrated circuit is an LM331.

10. The integrator circuit of claim 1, wherein the FET is a JFET.

11. The integrator circuit of claim 1, wherein the FET is a MOSFET.

12. The integrator circuit of claim 1, wherein the output voltage signal is tapped for measurement by an external meter.

13. The integrator circuit of claim 1, wherein the frequency discriminator is constructed on a single chip.

* * * * *